United States Patent [19]
Tsurushima

[11] 3,921,089

[45] Nov. 18, 1975

[54] TRANSISTOR AMPLIFIER

[75] Inventor: Katsuaki Tsurushima, Kawasaki, Japan

[73] Assignee: Sony Corporation, Tokyo, Japan

[22] Filed: Sept. 24, 1974

[21] Appl. No.: 508,836

[30] Foreign Application Priority Data

Sept. 28, 1973 Japan ............................ 48-109120

[52] U.S. Cl. ...................... 330/13; 330/15; 330/22; 330/35; 330/40

[51] Int. Cl.$^2$ ............................................ H03F 3/16

[58] Field of Search .............. 330/13, 15, 22, 35, 40

[56] References Cited

UNITED STATES PATENTS

| | | | |
|---|---|---|---|
| 3,675,141 | 7/1972 | Adams | 330/15 X |
| 3,818,361 | 6/1974 | Gunda | 330/22 |
| 3,862,367 | 1/1975 | Kono et al. | 330/13 X |

OTHER PUBLICATIONS

Ott., "Biasing the Junction Fet," *EEE*, Jan. 1970, pp. 52–57.

*Primary Examiner*—James B. Mullins
*Attorney, Agent, or Firm*—Lewis H. Eslinger; Alvin Sinderbrand

[57] ABSTRACT

A transistor amplifier includes at least one field effect transistor with triode characteristics employed for amplifying purposes, particularly in an output stage, with the drain and source electrodes of each such transistor being connected, through a load, between terminals of an operating voltage source which is subject to fluctuations, and with an input signal being applied to the gate electrode of the field effect transistor having triode characteristics. In order to ensure that fluctuations in the voltage of the operating voltage source will not cause variations in the biasing DC drain current of the transistors with triode characteristics, and consequent distortions in the amplifier output, a biasing circuit is provided for applying a gate bias voltage to the gate electrode of each field effect transistor with triode characteristics, and the biasing circuit includes a compensating arrangement for varying such gate bias voltage in response to fluctuations of the operating voltage source with the ratio of a voltage fluctuation of such source to the resulting variation of the gate bias voltage preferably being substantially proportional to the amplification constant of the field effect transistor, whereby to stabilize the biasing DC drain current. The foregoing arrangement is particularly suited for transistor amplifiers in which the output stage is constituted by an amplifier of the push-pull type employing field effect transistors with triode characterisitcs, and in which variations in the biasing DC drain currents resulting from operating voltage fluctuations would cause cross-over distortions.

20 Claims, 7 Drawing Figures

TRANSISTOR AMPLIFIER

BACKGROUND OF THE INVENTION

1. Field of the Invention

This invention relates generally to transistor amplifiers, and more particularly is directed to improved transistor amplifiers employing one or more field effect transistors having triode characteristics in the output stage thereof.

2. Description of the Prior Art

Field effect transistors are known which have vertical channels so as to exhibit triode characteristics. Such field effect transistors with triode characteristics have a relatively low output impedance, for example, on the order of about 10 ohms, and low distortion, in the absence of variations in the operating voltage, so as to be desirable for use in the output stages of audio power amplifiers. However, if the operating voltage applied to the drain-source electrodes of a field effect transistor having triode characteristics is subject to fluctuations, such fluctuations cause changes in a biasing current flowing through the field effect transistor and distortion results therefrom. The foregoing problem is accentuated when field effect transistors with triode characteristics are employed in a push-pull amplifier, in which case the described transistors are actuated so as to provide alternate ON/OFF operation thereof on the input signal so that crossover distortion occurs in response to the biasing current changes.

Although bipolar transistors and field effect transistors having pentode characteristics are relatively stable as regards changes in their biasing current resulting from fluctuations in the operating voltage applied thereto, such relative stability is achieved by reason of their very high output impedances which may be of the order of several meg-ohms and which make the bipolar transistors and field effect transistors with pentode characteristics undesirable for use in the output stages of audio power amplifiers. Further, bipolar transistors and field effect transistors with pentode characteristics have greater distortion than field effect transistors with triode characteristics in the absence of variation in the operating voltage applied to the latter.

SUMMARY OF THE INVENTION

Accordingly, an object of the present invention is to provide a transistor amplifier which is free of the above mentioned deficiencies of existing transistor amplifiers.

More specifically, it is an object of the invention to provide a transistor amplifier employing one or more field effect transistors with triode characteristics in its output stage, and in which distortions due to fluctuations in the operating voltage are avoided.

Another object is to provide a transistor amplifier, as aforesaid, which is particularly suited for use as a high quality audio power amplifier.

Still another object is to provide a transistor amplifier, as aforesaid, having an output stage of the push-pull type employing field effect transistors with triode characteristics, and in which compensation is provided to prevent variations in the biasing DC drain currents of such transistors, as a result of fluctuations in their operating voltages, and which would otherwise produce cross-over distortions.

In accordance with an aspect of this invention a transistor amplifier including one or more field effect transistors with triode characteristics employed for amplifying puposes, particularly in an output stage of the amplifier, with the drain and source electrodes of each such transistor being connected, through a load, between terminals of an operating voltage source which is subject to voltage fluctuations, and with an input signal to be amplified being applied to the gate electrode, is provided with a biasing circuit for applying a gate bias voltage to each such transistor and the biasing circuit includes a compensating arrangement by which the gate bias voltage is varied in response to fluctuations of the operating voltage source so as to maintain constant or stabilize the biasing DC drain current of each triode characteristics field effect transistor in spite of the operating voltage fluctuations. Preferably, the compensating arrangement of the biasing circuit is dimensioned so that the ratio of a fluctuation of the operating voltage source to the variation of the gate bias voltage that results therefrom is substantially proportional to the amplification constant of the triode characteristic field effect transistor.

In a preferred embodiment of the invention, a plurality of the triode characteristic field effect transistors are connected in a push-pull relationship to constitute the output stage of the amplifier, and biasing DC drain currents of such transistors are stabilized, as aforesaid, for avoiding crossover distortion that would otherwise result from fluctuations of the operating voltages for the transistors.

The above, and other objects, features and advantages of the invention, will be apparent from the following detailed description of illustrative embodiments which is to be read in connection with the accompanying drawings.

DESCRIPTION OF THE PREFERRED EMBODIMENTS

A field effect transistor with triode characteristics that is suitable for use in a transistor amplifier according to the present invention will first be described with reference to FIG. 1.

Figure 1:
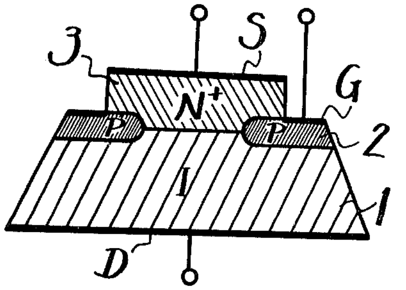
FIG. 1 is a sectional view showing an example of a field effect transistor with triode characteristics that may be used in a transistor amplifier according to the present invention.

As shown on FIG. 1, a field effect transistor having triode characteristics may include an intrinsic semiconductor region 1 of low impurity concentration and high resistance which has thereon an annular P-type semiconductor region 2 formed by a selective diffusion method or the like. An N-type semiconductor region 3 of high impurity concentration spreading over the intrinsic semiconductor region 1 and the P-type semiconductor region 2 is formed by an epitaxial method or the like. A drain electrode D is provided at the bottom of intrinsic semiconductor region 1, a gate electrode G is provided on P-type semiconductor region 2, and a source electrode S is provided on the upper surface of N-type semiconductor region 3.

Figure 2:
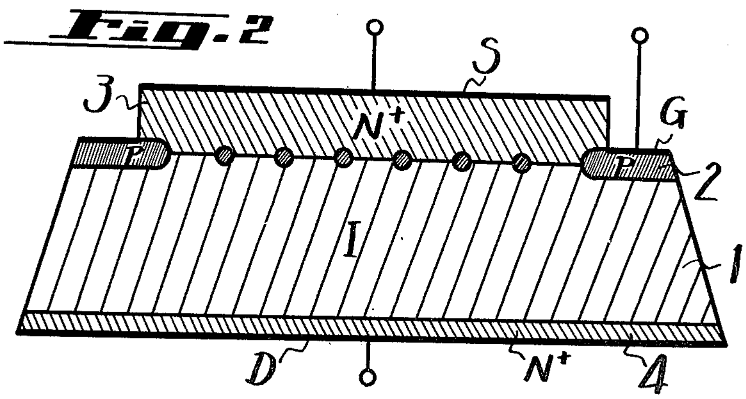
FIG. 2 is a sectional view showing another example of a field effect transistor with triode characteristics that may be used in a transistor amplifier according to the present invention.

Referring now to FIG. 2, in which elements corresponding to those described above with reference to FIG. 1 are identified by the same reference numerals, it will be seen that, in a preferred type of field effect transistor with triode charactertistics suitable for use in transistor amplifiers according to this invention, the P-type semiconductor region 2 is formed in a mesh-like configuration, and an N-type semiconductor region 4 of high impurity concentration is provided under the lower surface of the intrinsic semiconductor region for increasing the breakdown voltage between the drain and source electrodes D and S.

In the field effect transistors of FIGS. 1 and 2, increasing the gate voltage (negatively) causes growth of depletion layers from the portions of gate region 2 that extend between regions 1 and 3 and the channel is formed in region 3 between such gate portions. Since region 3 is shown to be of N-type conductivity, the field effect transistors illustrated on FIGS. 1 and 2 are N-channel transistors, however, it will be apparent that similar field effect transistors may be provided with the regions 2 and 3 thereof being of N-type and P-type conductivities, respectively, so as to be P-channel field effect transistors.

In any case, it will be apparent that each of the illustrated field effect transistors has a vertical channel, rather than a lateral channel as in a conventional field effect transistor. By reason of such vertical channel, both the distance between the source electrode S and the channel and the length of the channel itself are very small so that the field effect transistor has a very low output resistance or impedance, for example, on the order of about 10 ohms. It is a feature of field effect transistors of the type shown on FIGS. 1 and 2 that the drain current thereof does not become saturated in response to increasing of the voltage between the drain and source. As shown on FIG. 3, by way of example, in which the abscissa indicates drain voltage $V_D$ in volts (V) and the ordinate indicates drain current $I_D$ in milliampere (mA), with gate voltage $V_G$ in volts (V) being used as a parameter, the drain voltage-drain current characteristic curves of a field effect transistor with a vertical channel, such as is shown on FIGS. 1 and 2, are similar to those of a triode so that the illustrated field effect transistors can be said to have triode characteristics. More particularly, it will be seen that the drain voltage-drain current characteristic curves of FIG. 3, being similar to those of a triode, are straight for substantial portions of their lengths with such straight portions being steeply inclined and substantially parallel, to indicate a low output impedance and the capcity to provide a large output of excellent linearity and relatively low distortion.

As distinguished from the foregoing, in a conventional junction type field effect transistor having a lateral channel, the resistance between the source electrode and the channel, the resistance of the channel itself and the resistance between the channel and the drain electrode are all large with the result that the output resistance or impedance of the conventional field effect transistor is very high, for example, on the order of several meg-ohms, so as to exhibit so-called pentode characteristics. Accordingly, with the conventional field effect transistor having pentode characteristics, as the voltage applied to its drain electrode increases, the drain voltage-drain current characteristics of such transistor tend to cause saturation of the drain current at a predetermined value of the drain voltage.

Figure 3:
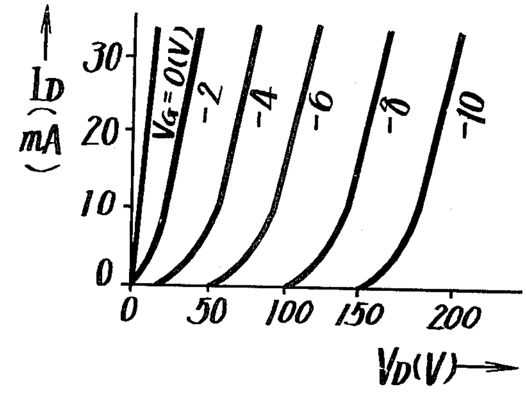
FIG. 3 is a graph illustrating typical output characteristics of a field effect transistor of the types shown in FIG. 1 and FIG. 2.
Figure 4:
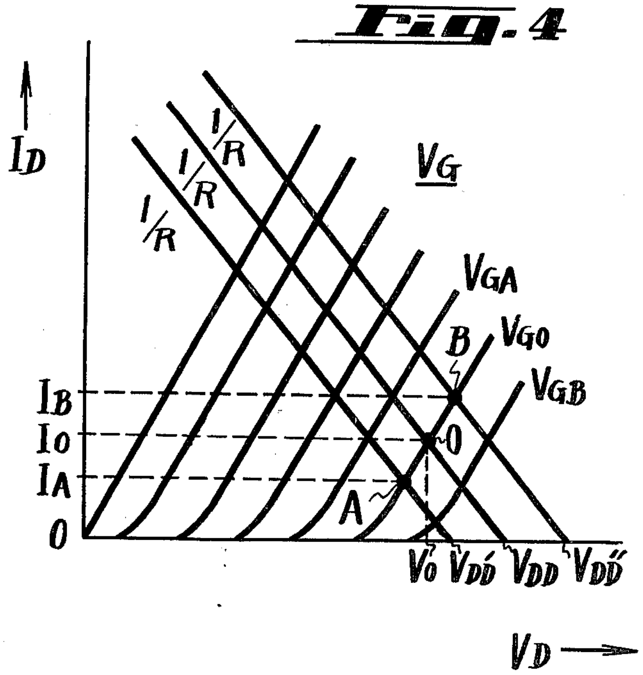
FIGS. 4 and 5 are graphs to which reference will be made in explaining the present invention.

Referring now to FIG. 4, in which the abscissa indicates drain voltage $V_D$, the ordinate indicates drain current $I_D$, and the gate voltage $V_G$ is again used as a parameter, as in FIG. 3, it will be seen that the drain voltage-drain current characteristic curves for a field effect transistor with triode characteristics, when used as the amplifying element in an amplifier, are similar to those shown on FIG. 3. If the gate voltage $V_G$ is assumed to be $V_{GO}$, and a load line having a gradient 1/R is drawn from a base or normal voltage $V_{DD}$ applied to the drain from a suitable source so as to intersect the drain voltage-drain current curve for the gate voltage $V_{GO}$ at the point O, such point O can be considered the normal operating point corresponding to a drain DC biasing current $I_o$. However, if the voltage applied from the voltage source to the drain fluctuates from the base or normal valute $V_{DD}$, for example, to the relatively lower value $V'_{DD}$ or the higher value $V''_{DD}$, the load line having the gradient 1/R shifts, as shown, to have the base point $V'_{DD}$ or $V''_{DD}$, respectively, and to intersect the characteristic curve for the gate voltage $V_{GO}$ at the point A or B, whereby the drain DC biasing current changes to the value $I_A$ or $I_B$, respectively. The foregoing characteristic of field effect transistors with triode characteristics is obviously disadvantageous in an audio output amplifier in that it introduces distortions in the amplified output in response to fluctuations in the operating voltage source.

Figure 5:
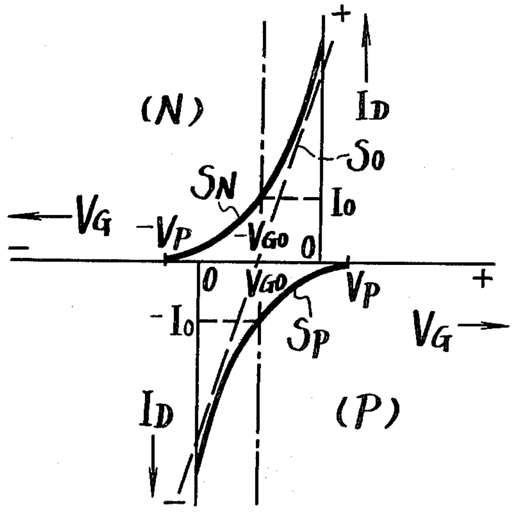

The above disadvantage of field effect transistors with triode characteristics is accentuated when such N-channel and P-channel transistors are employed in an audio output amplifier of the pure complementary push-pull type or AB-class. In that case, the N-channel and P-channel transistors with triode characteristics are selected to have gate voltage-drain current curves with remote cut-off characteristics. For example, as shown on FIG. 5, the N-channel and P-channel transistors for use in such an audio output amplifier may have the gate voltage ($V_G$)-drain current ($I_D$) curves shown in full lines at $S_N$ and $S_P$, respectively. When the gate voltages applied to the N-channel and P-channel transistors have the values $-V_{GO}$ and $V_{GO}$, respectively, the composite characteristic curve is, for example, as indicated in broken lines at $S_o$ on FIG. 5. However, when the DC biasing drain current of each of the transistors is lowered from $I_o$ to $I_A$ due to fluctuation of the voltages applied to the drains from the voltage source, as described above with reference to FIG. 4, a step is formed in the composite characteristic curve $S_o$ at the point of zero drain current, with the result that a cross-over distortion is introduced.

Generally, in accordance with this invention, the foregoing problem is avoided in AB-class push-pull amplifiers, as well as in any other type of amplifier employing one or more field effect transistors with triode characteristics for amplifying purposes, by suitably varying a DC bias voltage applied to the gate electrode of each such transistor in response to variations or fluctuations in the drain voltage, that is, the operating voltage for the transistor, whereby to maintain constant the DC biasing drainn current in spite of such fluctuations. For example, as shown on FIG. 4, if the operating voltage fluctuates from its normal value $V_{DD}$ to a reduced value $V'_{DD}$ so as to vary the drain current from $I_o$ to $I_A$, the drain current is restored to its value $I_o$ by reducing the gate voltage from the value $V_{GO}$ to the value $V_{GA}$ which corresponds to the drain voltage-drain current curve intersected at the drain current value $I_o$ by the load line extending from the voltage $V'_{DD}$. Conversely, as also shown on FIG. 4, if the operating voltage fluctuates from its normal value $V_{DD}$ to an increased value $V''_{DD}$ so as to change the drain current from $I_o$ to $I_B$, the drain current is restored to its value $I_o$ by increasing the gate voltage from the value $V_{GO}$ to the value $V_{GB}$ which corresponds to the drain voltage-drain current curve intersected at the drain current value $I_o$ by the load line extending from the voltage $V''_{DD}$.

Figure 6:
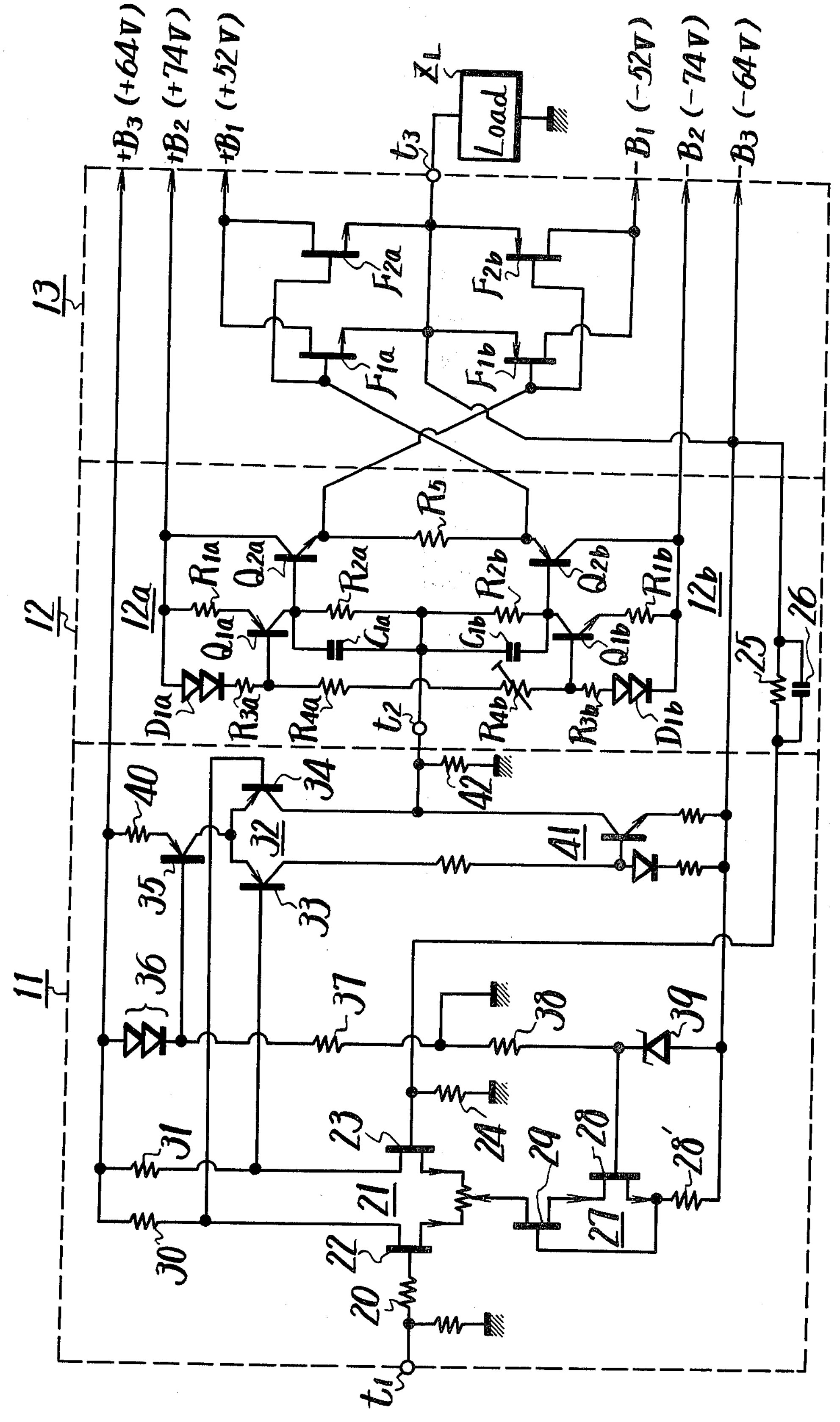
FIG. 6 is a circuit diagram showing a transistor amplifier according to one embodiment of the present invention.

Referring now to FIG. 6, it will be seen that the invention is there shown applied to an amplifier circuit which generally comprises a driving stage 11 in the form of a conventional A-class amplifier, a pure complementary push-pull output stage 13 employing field effect transistors with triode characteristics for amplifying purposes, and a biasing circuit 12 embodying the present invention so as to compensate for fluctuations in the operating voltage applied from a suitable voltage source to the field effect transistors with triode characteristics in output stage 13.

In the driving stage 11 constituted by a conventional A-class amplifier, an input terminal $t_1$ for receiving a signal to be amplified is connected through a resistor 20 to the gate electrode of a field effect transistor 22 which forms a differential amplifier 21 together with a field effect transistor 23. In order to supply a negative feedback signal, a parallel circuit of a resistor 25 and a capacitor 26 is connected between the gate electrode of transistor 23 and the output stage 13 and a resistor 24 is connected between the said gate electrode and the ground. A constant current circuit 27 is provided as a common source impedance of the differential amplifier 21. Constant current circuit 27 is shown to consist of cascode-connected field effect transistors 28 and 29. The field effect transistors 22, 23, 28 and 29 have normal pentode characteristics and a resistor 28' is provided as a biasing resistor for transistor 28. The output side of differential amplifier 21 is connected through load resistors 30 and 31 to a voltage source terminal $+B_3$, and biasing resistor 28' is connected between the source electrode of transistor 29 and a voltage source terminal $-B_3$. A second differential amplifier 32 is included in driving stage 11 and consists of conventional bipolar transistors 33 and 34, with a constant current transistor 35 being provided as a common emitter impedance for differential amplifier 32. A biasing circuit for the constant current transistor 35 and the field effect transistor 28 is shown to include a diode 36, resistors 37 and 38 and a Zener diode 39 connected between the voltage source terminals $+B_3$ and $-B_3$. The DC voltage across the Zener diode 39 is applied to transistor 28, at its fixed biasing voltage, and the DC voltage across diode 36 is used as the biasing voltage for constant current transistor 35. The emitter electrode of transistor 35 is connected through a constant current setting resistor 40 to the voltage source terminal $+B_3$, and the collector side of differential amplifier 32 is connected through a constant current circuit 41 to the voltage source terminal $-B_3$. An output terminal $t_2$ of the A-class amplifier constituting driving stage 11 is led out from the collector electrode of transistor 34, and a resistor 42 is connected between terminal $t_2$ and ground to establish a reference potential of the biasing circuit 12 which will be hereinafter described. It will be apparent that an input signal applied to input terminal $t_1$ of the A-class amplifier constituting driving stage 11 is amplified by the differential amplifiers 21 and 32 to provide an output signal at terminal $t_2$ having a sufficient gain for driving the push-pull output stage 13.

The illustrated pure complementary push-pull output stage 13 is shown to generally include a pair of N-channel field efect transistors with triode characteristics, as indicated at $F_{1a}$ and $F_{2a}$, and a pair of P-channel field effect transistors with triode characteristics, as indicated at $F_{1b}$ and $F_{2b}$, with parallel push-pull connections between such transistors. More specifically, as shown, the drain electrodes of N-channel transistors $F_{1a}$ and $F_{2a}$ are connected to a terminal $+B_1$ of a voltage source whose other terminal is constituted by the ground, while the source of electrodes of transistors $F_{1a}$ and $F_{2a}$ are connected to such other terminal or ground by way of an output terminal $t_3$ of output stage 13 and through a load $Z_L$ which may be constituted by a speaker. The P-channel transistors $F_{1b}$ and $F_{2b}$ have their drain electrodes connected to a terminal $-B_1$ of a voltage source whose other terminal is again constituted by ground, and the source electrodes of transistors $F_{1b}$ and $F_{2b}$ are connected to such other terminal by way of output terminal $t_3$ and through load $Z_L$.

The biasing circuit 12 is shown to be composed of a first biasing circuit 12$a$ for supplying a biasing voltage to transistors $F_{1b}$ and $F_{2b}$, and a second biasing circuit 12$b$ for supplying a biasing voltage to the transistors $F_{1a}$ and $F_{2a}$. These biasing circuits 12$a$ and 12$b$ form a constant current circuit, and further function to compensate for fluctuations in the voltages applied from the voltage source terminals $+B_1$ and $-B_1$ to the drain electrodes of the transistors $F_{1a}$ and $F_{2a}$ and of the transistors $F_{1b}$ and $F_{2b}$, respectively.

In the embodiment of the invention illustrated in FIG. 6, the biasing circuit 12$a$ includes a PNP-type bipolar transistor $Q_{1a}$ having its emitter electrode connected through a resistor $R_{1a}$ to a voltage source terminal $+B_2$, while the collector electrode of transistor $Q_{1a}$ is connected through a parallel connection of a resistor $R_{2a}$ and a capacitor $C_{1a}$ to output terminal $t_2$ of the driving stage 11. The base electrode of transistor $Q_{1a}$ is connected through a series circuit of a resistor $R_{4a}$ and a variable resistor $R_{4b}$ to the base electrode of an –NPN-type bipolar transistor $Q_{1b}$ which is included in the second biasing circuit 12$b$. The base electrode of transistor $Q_{1a}$ is also connected through a resistor $R_{3a}$ to the cathode of a diode $D_{1a}$ which has its anode connected to voltage source terminal $+B_2$. The variable resistor $R_{4b}$ is adjustable to relatively vary the gate biasing voltages of transistors $F_{1a}$ and $F_{1b}$ and of transistors $F_{2a}$ and $F_{2b}$. Biasing circuit 12$a$ is further shown to include an NPN-type bipolar transistor $Q_{2a}$ for impedance conversion or amplification with an emitter-follower configuration. Transistor $Q_{2a}$ has its base electrode connected to the collector electrode of transistor $Q_{1a}$, its collector electrode connected to voltage source terminal $+B_2$, and its emitter electrode connected to the gate electrodes of transistors $F_{1b}$ and $F_{2b}$. Further, the emitter electrode of transistor $Q_{2a}$ is connected through a resistor $R_5$ to the emitter electrode of -PNP-type bipolar transistor $Q_{2b}$ which is also included in the second biasing circuit 12$b$.

In the second biasing circuit 12*b*, the NPN-type transistor $Q_{1b}$ has its emitter electrode connected through a resistor $R_{1b}$ to a voltage source terminal $-B_2$, while its collector electrode is connected to the base electrode of the transistor $Q_{2b}$ and also through a parallel connection of a resistor $R_{2b}$ and a capacitor $C_{1b}$ to the output terminal $t_2$ of driving stage 11. The base electrode of transistor $Q_{1b}$ is connected through a resistor $R_{3b}$ to the anode of a diode $D_{1b}$, while the cathode of such diode is connected to the voltage source terminal $-B_2$. Further, the PNP-type transistor $Q_{2b}$ for impedance conversion or amplification has its collector electrode connected to the voltage source terminal $-B_2$, and its emitter electrode is connected to the gate electrodes of transistors $F_{1a}$ and $F_{2a}$.

In the embodiment illustrated on FIG. 6, the voltage source terminals +Bhd 3 and $-B_3$ may respectively provide +64V. DC and −64V. DC which, as described above, are applied to driving stage 11 as the operating voltages for the latter. Such voltages are required to be constant or stabilized as they are used for the voltage amplifier.

The voltage source terminals $+B_1$, $+B_2$, $-B_1$, $-B_2$ may provide nominal DC voltages of +52V., +74V., −52V. and −74V., respectively, which are not stabilized so that considerable ripple components may appear therein in response to variations in the load current. However, the voltage source terminals $+B_1$, $+B_2$, $-B_1$ and $-B_2$ are provided on a common voltage source circuit (not shown) so that equal voltage fluctuations will normally occur simultaneously at such voltage source terminals. In other words, an increase in the positive voltage at terminal $+B_1$ from its nominal value of +52V., for example, will be accompanied by an equal increase, in the positive direction, in the voltage at terminal $+B_2$ and by equal increases, in the negative direction, in the voltages at terminals $-B_1$ and $-B_2$.

With the above described arrangement in biasing circuit 12, the biasing circuits 12*a* and 12*b* are symmetrical with respect to output terminal $t_2$ of driving stage 11, and the input signal voltages applied to the collector electrodes of transistors $Q_{1a}$ and $Q_{1b}$ are varied in phase with each other, so that the output terminal $t_2$ may be regarded as being grounded from a biasing DC voltage point of view. With the foregoing in mind, and assuming that, in the biasing circuit 12*a*, the values of resistors $R_{1a}$, $R_{2a}$, $R_{3a}$ and $R_{4a}$ of biasing circuit 12*a* respectively are $r_1$, $r_2$, $r_3$ and $r_4$, the voltage of voltage source terminal $+B_2$ is $E_{GG}$, the base-emitter voltage of transistor $Q_{1a}$ is $V_{BE}$, the forward voltage of diode $D_{1a}$ is $V_d$ and the ratio $r_2/r_1$ is K, then the DC voltage $E_0$ obtained at the collector electrode of transistor $Q_{1a}$ may be expressed as follows:

$$E_o = \left[ V_d + \frac{r_3}{r_3 + r_4}(E_{GG} - V_d) - V_{BE} \right] K \qquad (1)$$

If equation (1) is partially differentiated by $E_{GG}$, the following equation is obtained:

$$\frac{\delta E_o}{\delta E_{GG}} = K \cdot \frac{r_3}{r_3 + r_4} \qquad (2)$$

Further, if the amplification constant of each of the transistors $F_{1b}$ and $F_{2b}$ is $\mu$, the following equation is established as inherent in the triode characteristics of such transistors:

$$\frac{\delta E_o}{\delta E_{GG}} = \frac{1}{\mu} \qquad (3)$$

By substituting equation (3) in equation (2), the following equation is obtained:

$$\mu K \cdot \frac{r_3}{r_3 + r_4} = 1 \qquad (4)$$

If the values of *K*, $r_3$ and $r_4$ are selected so as to satisfy equations (1) and (4), the DC biasing drain current $I_{do}$ of transistors $F_{1b}$ and $F_{2b}$ can be made constant independent of voltage fluctuations at the voltage source terminal $-B_1$.

If, as in a practical example, $E_o = 21$V., $E_{GG} = 74$V., $V_d = 1.3V$, $V_{BE} = 0.6V$ and $\mu = 8.1$, the substitution of the foregoing values in equation (1) and also the substitution of $1/\mu$K for $$\left( \frac{r_3}{r_3 + r_4} \right)$$

(from equation (4)), makes it possible to solve simply for $K$=17.2, that is, $r_2/r_1$=17.2. Further, by substituting $\mu$ =8.1 and $K$=17.2 in equation (4), $r_4/r_3$=138 is obtained. Therefore, in this example, if the values $r_1$ and $r_3$ for resistors $R_{1a}$ and $R_{3a}$ are selected to be 820 ohms and 270 ohms, respectively, then the values $r_2$ and $r_4$ for resistors $R_{2a}$ and $R_{4a}$ have to be approximately 14 K. ohms and 37 K. ohms, respectively, to provide the desired stabilization of the DC biasing drain current of transistors $F_{1b}$ and $F_{2b}$ in the face of fluctuations in their operating voltage at terminal $-B_1$.

Since the second biasing circuit 12*b* is constructed symmetrically with respect to biasing circuit 12*a*, the circuit constants of circuit 12*b* can be selected to be similar to those described above with reference to circuit 12*a*, whereby to provide the desired stabilization of the DC biasing drain current of transistors $F_{1a}$ and $F_{2a}$ in the face of fluctuations in their operating voltage at terminal $+B_1$.

In the embodiment of FIG. 6, when the voltage source circuit is switched on, the gate biasing voltages are not immediately applied to the triode-characteristic transistors $F_{1a}$, $F_{2a}$, $F_{1b}$ and $F_{2b}$ so that an excess or over-current may flow therethrough. However, if the voltage at source terminal $+B_2$ is made to rise more quickly than that at voltage source terminal $+B_1$ , it is possible to control the current flow so as not to exceed the desired DC biasing drain current. In other words, if the gate biasing voltages $V_{GG}$ and $-V_{GG}$ are made to rise more quickly than the drain voltages $V_{DD}$ and $-V_{DD}$ applied to the triode-characteristic transistors $F_{1a}$, $F_{2a}$, $F_{1b}$ and $F_{2b}$ by the voltage source terminals $+B_1$ and $-B_1$, the respective DC biasing drain currents can be prevented from becoming excessive. In this connection, it will be noted that the described biasing circuit 12 does not include any time constant circuits.

Further, it will be noted that biasing circuit 12 employing the bipolar transistors $Q_{1a}$ and $Q_{1b}$, as described above, acts as a constant current circuit so long as the voltage supplied from the voltage source terminal $+B_2$ or $-BO_2$ is not changed, with the result that constant currents flow through transistors $Q_{1a}$ and $Q_{1b}$, and the respective collector electrodes provide constant voltages which are supplied through transistors $Q_{2a}$ and $Q_{2b}$ to the gate electrodes of the respective transistors $F_{1b}$, $F_{2b}$ and $F_{1a}$, $F_{2a}$. However, as previously noted, when the voltages at voltage source terminals $+B_1$ and $-B_1$ are varied, the voltages at voltage source terminals $+B_2$ and $-B_2$ are similarly varied, and hence the gate biasing voltages are changed so as to cancel the fluctuation of the DC biasing drain currents due to the voltage fluctuations at terminals $+B_1$ and $-B_1$. Consequently, the DC biasing drain currents of the transistors $F_{1a}$, $F_{2a}$, $F_{1b}$ and $F_{2b}$ are stabilized.

It will be apparent that the transistors $Q_{2a}$ and $Q_{2b}$, which are provided for impedance conversion, may be theoretically omitted from the biasing circuits 12$a$ and 12$b$ without affecting the operation of the latter in stabilizing the DC biasing drain currents of the triode-characteristic field effect transistors in output stage 13. Further, although the output stage 13 is shown to include a pair of triode-characteristic field effective transistors $F_{1a}$ and $F_{2a}$ connected in parallel with each other and in push-pull relation to the other pair of parallel connected triode-characteristic field effect transistors $F_{1b}$ and $F_{2b}$, the circuit 12 according to this invention may be associated with an output stage having additional triode-characteristic field effect transistors connected in parallel with transistors $F_{1a}$ and $F_{2a}$ and with transistors $F_{1b}$ and $F_{2b}$, respectively, or with an output stage having only the transistors $F_{1a}$ and $F_{1b}$ in push-pull relationship. Further, the present invention can be applied to an amplifier having only a single triode-characteristic field effect transistor, for example, the transistor $F_{1a}$, in association with a suitable biasing circuit, such as the biasing circuit 12$b$.

Another embodiment of this invention will now be described with reference to FIG. 7. In this embodiment, a simplified biasing circuit 12' is provided for the pure complementary push-pull output stage 13 using triode-characteristic field effect transistors $F_a$ and $F_b$. The biasing circuit 12' is composed of the first and second biasing circuits 12'$a$ and 12'$b$ which are symmetrical to each other. In the first biasing circuit 12'$a$, the output terminal $t_2$ of the driving stage 11 is connected to the anode of a Zener diode $D_{Za}$, while the cathode of the latter is connected through a resistor $F'_{4a}$ to the gate electrode of transistor $F_b$ and also through a resistor $R'_{3a}$ to the voltage source terminal $+B_2$. Similarly, in the second biasing circuit 12'$b$, the output terminal $t_2$ of driving stage 11 is connected to the cathode of a Zener diode $D_{Zb}$, while the anode of the latter is connected through a resistor $F'_{4b}$ to the gate electrode of transistor $F_a$ and also through a resistor $R'_{3b}$ to the voltage source terminal $-B_2$.

Considering first the biasing circuit 12'$a$, it will be noted that, if $r'_3$ and $r'_4$ are the values of resistors $R'_{3a}$ and $R'_{4a}$, $V_Z$ is the Zener voltage of Zenor diode $D_{Za}$, and the voltage at voltage source terminal $+V_2$ is $E_{GG}$, then the DC voltage $E_o$ obtained at the connection point of resistors $R'_{3a}$ and $R'_{4a}$, and applied to the gate electrode of transistor $F_b$, is expressed as follows:

$$E_o = V_Z + (E_{GG} - V_Z)\frac{r'_4}{r'_3+r'_4} \qquad (5)$$

If equation (5) is partially differentiated by $E_{GG}$, the following equation is obtained:

$$\frac{\delta E_o}{\delta E_{GG}} = \frac{r'_4}{r'_3 + r'_4} \qquad (6)$$

In view of equation (3) which is characteristic of each of transistors $Fa$ and $Fb$, equation (6) can be re-written as:

$$\frac{1}{\mu} = \frac{r'_4}{r'_3+r'_4}$$

or $$\mu = \frac{r'_3 + r'_4}{r'_4} \qquad (7)$$

Figure 7:
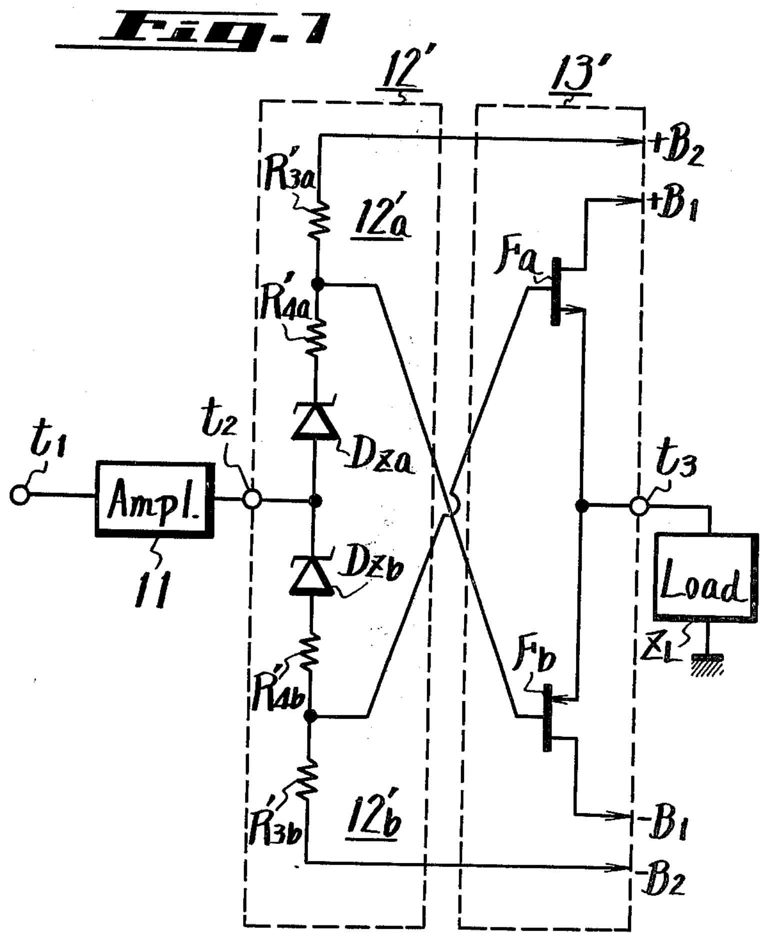
FIG. 7 is a circuit diagram showing a transistor amplifier according to another embodiment of the present invention.

Once again, the biasing circuit 12' of FIG. 7 will be effective to maintain constant or stabilize the DC biasing drain currents of transistors $Fa$ and $Fb$, notwithstanding the occurrence of fluctuations in the voltages at the voltage source terminals $+B_1$, $+B_2$, $-B_1$ and $-B_2$, if the various circuit elements are selected to satisfy equations (5) and (7). Thus, for example, if the amplification constant $\mu$ of transistors $Fa$ and $Fb$ is 8.1, the solution of equation (7) becomes $r'_3/r'_4=7.1$. Accordingly, if resistor $R'_{4a}$ is selected to have a value $r'_4=4.7$-K.ohm, then resistor $R'_{3a}$ has to be provided with a value $r'_3=33.4$K.ohm. Further, if $E_o$ and $E_{GG}$ are 21V. and 74V., respectively, the solution of equation (5), with $r'_3=33.4$K.ohm and $r'_4=4.7$K.ohm, results in the Zener diode $D_{Za}$ being required to have a Zener voltage $V_Z=13.6$ for stabilizing the DC biasing drain current of transistor $Fb$. Similar circuit constants can be selected for biasing circuit 12'$b$ so as to stabilize the DC biasing drain current of transistor $Fa$.

Although the biasing circuit 12' of FIG. 7 is quite simple in construction as compared with the biasing circuit 12 of FIG. 6, it has the relative disadvantage of requiring the selection of the Zener diodes $D_{Za}$ and $D_{Zb}$ to have specific Zener voltages, as indicated above.

Further, in each of the embodiments shown in FIGS. 6 and 7, the field effect transistors $F_{1a}$, $F_2$ and $F_{1b}$, $F_{2b}$, or $F_a$ and $F_b$ forming the push-pull output stage 13 or 13; are of complementary types. However, even if triode characteristic field effect transistors with the same polarity are used, the same effect can be achieved, that is, the DC biasing drain currents for such transistors can be stabilized notwithstanding fluctuations in their operating voltages, but, in such case, the input signals respectively applied to the field effect transistors in push-pull relation have to be reversed in phase relative to each other.

It will be apparent from the foregoing that transistor amplifiers according to this invention have low distortion characteristics due to the excellent linearity of the field effect transistors with triode characteristics which are employed therein, particularly in the output stage, and to which a load can be directly connected at its output terminal because of the low output resistances of such transistors. Push-pull amplifiers having one or more pairs of field effect transistors with triode characteristics, according to this invention, have a low switching distortion, because each of such field effect transistors is basically a unipolar semiconductor device having high speed switching characteristics with no carrier being stored and thus is effective for use in an audio power amplifier.

Although illustrative embodiments of the invention have been described in detail herein with reference to the drawings, it is to be understood that the invention is not limited to those precise embodiments and that many variations and modifications may be effected therein by one skilled in the art without departing from the scope and spirit of the present invention as defined in the appended claims.

What is claimed is:

1. A transistor amplifier comprising: voltage supply means for supplying an operating voltage susceptible to voltage fluctuations: at least a first triode characteristic field effect transistor having gate, source and drain electrodes; means for applying said operating voltage across said drain and source electrodes through a load; input circuit means for applying an input signal to be amplified to said gate electrode of the triode characteristic field effect transistor; and biasing circuit means for applying a gate bias voltage to said gate electrode and including compensating means connected between said voltage supply means and said gate electrode for varying said gate bias voltage in response to voltage fluctuations in said operating voltage so as to stabilize the biasing DC drain current of said triode characteristic field effect transistor in spite of said voltage fluctuations in the operating voltage therefor.

2. A transistor amplifier according to claim 1; in which said compensating means varies said gate bias voltage by an amount that is $1\mu$ times the voltage fluctuation in said operating voltage, and in which $\mu$ is the amplification constant of said triode characteristic field effect transistor.

3. A transistor amplifier according to claim 1; in which said triode characteristic field effect transistor is a P-channel type.

4. A transistor amplifier according to claim 1; in which said diode characteristic field effect transistor is an N-channel type.

5. A transistor amplifier according to claim 1; further comprising a second triode characteristic field effect transistor also having gate, source and drain electrodes, and means for applying said operating voltage across said drain and source electrodes of said second triode characteristic field effect transistor through said load; and in which said input circuit means applies said input signal to said gate electrode of said second triode characteristic field effect transistor so as to drive said first and second triode characteristic field effect transistors with a push-pull relationship therebetween, and said biasing circuit means also applies a second gate bias voltage to said gate electrode of the second triode characteristic field effect transistor with said compensating means also varying said second gate bias voltage in response to said voltage fluctuations for stabilizing the biasing DC drain current of said second triode characteristic field effect transistor.

6. A transistor amplifier according to claim 5; in which said first and second triode characteristic field effect transistors have complementary conductivites, respectively, and said operating voltage applied across said drain and source electrodes of said first field effect transistor through a load has its polarity reversed in respect to the polarity of said operating voltage as applied across said drain and source electrodes of said second field effect transistor through said load.

7. A transistor amplifier according to claim 5; in which said compensating means varies each of the first mentioned and second gate bias voltages by an amount that is $1/\mu$ times the voltage fluctuation of said operating voltage for said first and second triode characteristic field effect transistors, with $\mu$ being the amplification constant of said first and second transistors.

8. A transistor amplifier according to claim 5; further comprising third and fourth triode characteristic field effect transistors connected in parallel with said first and second triode characteristic field effect transistors and in push-pull relation to each other.

9. A transistor amplifier according to claim 5; in which said input circuit means includes an A-class driver stage whose output is applied to said gate electrodes of said first and second triode characteristic field effect transistors for driving the latter with push-pull operation thereof.

10. A transistor amplifier comprising: a voltage source for supplying an operating voltage susceptible to voltage fluctuations; at least a first triode characteristic field effect transistor having gate, source and drain electrodes; means for applying said operating voltage across said drain and source electrodes through a load; input circuit means for applying an input signal to be amplified to said gate electrode of the triode characteristic field effect transistor; and biasing circuit means for applying a gate bias voltage to said gate electrode and including a transistor having first, second and third electrodes, constant voltage means, first, second, third and fourth resistors, means for applying a voltage which flucturates with said fluctuations of the operating voltage across said first and second electrodes through said first and second resistors, respectively, said third and fourth resistors being connected with said constant voltage means in a series circuit to which said voltage which fluctuates with said fluctuations of the operating voltage is also applied, said third electrode being connected to said series circuit between said third and fourth resistors, means for applying the voltage across one of said first and second resistors to said gate electrode as said gate bias voltage for the triode characteristic field effect transistor, and said resistors having respective resistance values which are selected so that said voltage across said one resistor varies in response to said fluctuations in the operating voltage by amounts that are $1/\mu$ times said fluctuations, with $\mu$ being the amplification constant of said triode characteristic field effect transistor, for stabilizing the biasing DC drain current of said triode characteristic field effect transistor in spite of said voltage fluctuations in the operating voltage therefor.

11. A transistor amplifier according to claim 10; in which said first, second and third electrodes of the transistor included in said biasing means are respectively emitter, collector and base electrodes of a bipolar transistor.

12. A transistor amplifier according to claim 10; in which said first, second, third and fourth resistors have respective resistance values $r_1$, $r_2$, $r_3$ and $r_4$ selected to satisfy the following equation:

$$\mu(r_2/r_1) \cdot \left(\frac{r_3}{r_3 + r_4}\right) = 1$$

in which $\mu$ is said amplification constant of said triode characteristic field effect transistor.

13. A transistor amplifier comprising: a voltage source for supplying an operating voltage susceptible to voltage fluctuations; at least a first triode characteristic field effect transistor having gate, source and drain electrodes; means for applying said operating voltage across said drain and source electrodes through a load; input circuit means for applying an input signal to be amplified to said gate electrode of the triode characteristic field effect transistor; and biasing circuit means for applying a gate bias voltage to said gate electrode and including constant voltage means, first and second resistors connected with said constant voltage means in a series circuit, means for applying to said circuit a voltage which fluctuates with said fluctuations of the operating voltage, said gate electrode being connected to said series circuit between said first and second resistors so that the voltage across one of said resistors is applied to said gate electrode as said gate bias voltage for the triode characteristic field effect transistor, and said resistors having respective resistance values which are selected so that said voltage across said one resistor varies in response to said fluctuations in the operating voltage by amounts that are $1/\mu$ times said fluctuations, with $\mu$ being the amplification constant of said triode characteristic field effect transistor, for stabilizing the biasing DC drain current of said triode characteristic field effect transistor in spite of said voltage fluctuations in the operating voltage therefor.

14. A transistor amplifier according to claim 13; in which said first and second resistors have respective resistance values $r'_3$ and $r'_4$ selected to satisfy the following equation:

$$\mu = \frac{r'_3 + r'_4}{r'_4}$$

in which $\mu$ is said amplification constant of said triode characteristic field effect transistor.

15. A transistor amplifier comprising: at least first and second triode characteristic field effect transistors each having gate, source and drain electrodes, a voltage source having a point of reference potential, and first, second, third and fourth terminals, with the operating voltages for said first and second triode characteristic field effect transistors appearing between said first and second terminals, respectively, and said point of reference potential and being susceptible to voltage fluctuations, and with voltages with fluctuate with said fluctuations of the operating voltages for said first and second triode characteristic field effect transistors, respectively, appearing between said third and fourth terminals, respectively, and said point of reference potential; means for applying said operating voltages for said first and second triode characteristic field effect transistors across said drain and source electrodes of the respective transistors through a load; input circuit means for applying an input signal to be amplified to the gate electrodes of said first and second triode characteristic field effect transistors, respectively, so as to drive the latter with a push-pull relationship therebetween; and biasing circuit means for applying gate bias voltages to the gate electrodes of said first and second triode characteristic field effect transistors including a first transistor having first, second and third electrodes and a first constant voltage means associated with a first set of interconnected resistors, and a second transistor having first, second and third electrodes and a second constant voltage means associated with a second set of interconnected resistors, each of said first and second sets of resistors including first, second, third and fourth resistors, said first resistors of said first and second sets being connected between said first electrodes of said first and second transistors and said third and fourth terminals, respectively, said second resistors of said first and second sets being connected between said second electrodes of said first and second transistors and said point of reference potential, said third resistors of said first and second sets being connected in series with said first and second constant voltage means, respectively, between said third electrode of said first transistor and said third terminal, and between said third electrode of said second transistor and said fourth terminal, respectively, said fourth resistors of said first and second sets being connected in series between said third electrodes of said first and second transistors, respectively, means for applying the voltage across one of said first and second resistors of said first and second sets to said gate electrodes of said first and second triode characteristic field effect transistors, respectively, as said gate bias voltages for the latter, and said resistors of said first and second sets have resistance values which are related so that said voltage across said one resistor of each of said sets varies in response to said fluctuations in the respective operating voltage by amounts that are $1/\mu$ times said fluctuations, with $\mu$ being the amplification constant of each of said first and second triode characteristic field effect transistors, for stabilizing the biasing DC drain currents of said first and second triode characteristic field effect transistors in spite of said voltage fluctuations in the operating voltages therefor.

16. A transistor amplifier according to claim 15; in which said first, second, third and fourth resistors of each of said sets have respective resistance values $r_1$, $r_2$, $r_3$ and $r_4$ selected to satisfy the equation $$\mu(r_2/r_1) \cdot \left(\frac{r_3}{r_3 + r_4}\right) = 1$$

in which $\mu$ is said amplification constant of the respective triode characteristic field effect transistor.

17. A transistor amplifier according to claim 15; in which said fourth resistor of one of said sets is variable for relatively adjusting the gate bias voltages applied to the gate electrodes of said first and second triode characteristic field effect transistors.

18. A transistor amplifier according to claim 15; further comprising third and fourth transistors interposed between said input circuit means and said first and second triode characteristic field effect transistors, respectively, with emitter follower configurations for driving the respective triode characteristic field effect transistors.

19. A transistor amplifier comprising: at least first and second triode characteristic field effect transistors each having gate, source and drain electrodes; a voltage source having a point of reference potential, and first, second, third and fourth terminals, with operating voltages for said first and second triode characteristic field effect transistors appearing between said first terminal and said point of reference potential and between said second terminal and said point of reference potential, and with voltages which fluctuate with said fluctuations of the operating voltages for said first and second triode characteristic field effect transistors, respectively, appearing between said third and fourth terminals, respectively, and said point of reference potential; means for applying said operating voltages for said first and second triode characteristic field effect transistors across the respective drain and source electrodes through a load; input circuit means for applying an input signal to be amplified to the gate electrodes of said first and second triode characteristic field effect transistors, respectively, so as to drive the latter with a push-pull relationship therebetween; and biasing circuit means for applying gate bias voltages to the gate electrodes of said first and second triode characteristic field effect transistors including first and second constant voltage means, and first and second sets of resistors; each of said first and second sets of resistors including first and second resistors; said first and second resistors of said first and second sets being connected in first and second series circuits with said first and second constant voltage means, respectively; said first and second series circuits being connected between said third and fourth terminals, respectively, and said point of reference potential; said gate electrodes of said first and second triode characteristic field effect transistors being connected to said first and second series circuits, respectively, between said first and second resistors of the respective series circuit so that the voltages across one of said resistors in said first and second series circuits, respectively, are applied to the gate electrodes of said first and second triode characteristic field effect transistors, respectively, as said gate bias voltage for the latter; and said resistors of said first and second sets having resistance values which are related so that said voltage across said one resistor of each of said sets varies in response to said fluctuations in the respective operating voltage by amounts that are $1/\mu$ times said fluctuations, with $\mu$ being the amplification constant of each of said first and second triode characteristic field effect transistors, for stabilizing the biasing DC drain currents of said first and second triode characteristic field effect transistors in spite of said voltage fluctuations in said operating voltages therefor.

20. A transistor amplifier according to claim 19; in which said first and second resistors of each of said sets have respective resistance values $r'_3$ and $r'_4$ selected to satisfy the equation $$\mu = \frac{r'_3 + r'_4}{r'_4}$$

in which $\mu$ is said amplification constant of the respective triode characteristic field effect transistor.

* * * * *